United States Patent
McDiarmid et al.

(10) Patent No.: US 6,301,434 B1
(45) Date of Patent: Oct. 9, 2001

(54) APPARATUS AND METHOD FOR CVD AND THERMAL PROCESSING OF SEMICONDUCTOR SUBSTRATES

(75) Inventors: James McDiarmid, Pleasanton; Kristian E. Johnsgard, Los Gatos; Steven E. Parks, Fremont; Mark W. Johnsgard, Campbell, all of CA (US)

(73) Assignee: Mattson Technology, Inc., Fremont, CA (US)

( * ) Notice: Subject to any disclaimer, the term of this patent is extended or adjusted under 35 U.S.C. 154(b) by 0 days.

(21) Appl. No.: 09/274,815

(22) Filed: Mar. 22, 1999

Related U.S. Application Data (60) Provisional application No. 60/079,017, filed on Mar. 23, 1998.

(51) Int. Cl.[7] .................................................. F26B 19/00
(52) U.S. Cl. ........................ 392/416; 219/390; 219/405; 118/724; 118/725
(58) Field of Search .................................... 219/390, 405, 219/411; 118/724, 725, 50.1; 392/416, 418

(56) References Cited

U.S. PATENT DOCUMENTS

| | | | |
|---|---|---|---|
| 4,421,786 | 12/1983 | Mahajan et al. | 427/82 |
| 4,496,609 | 1/1985 | McNeilly et al. | 427/55 |
| 4,654,509 | 3/1987 | Robinson et al. | 219/405 |
| 4,680,451 | 7/1987 | Gat et al. | 219/411 |
| 4,728,389 | 3/1988 | Logar | 156/612 |
| 4,755,654 | 7/1988 | Crowley et al. | 219/405 |
| 4,789,771 | 12/1988 | Robinson et al. | 219/405 |
| 4,798,165 | 1/1989 | deBoer et al. | 118/715 |
| 4,800,105 | 1/1989 | Nakayama et al. | 427/253 |
| 4,874,464 | 10/1989 | Goodwin et al. | 156/646 |
| 4,920,918 | 5/1990 | Adams et al. | 118/724 |
| 5,094,885 | * 3/1992 | Selbrede | 427/248 |
| 5,156,820 | 10/1992 | Wong et al. | 422/186.05 |
| 5,194,401 | 3/1993 | Adams et al. | 437/173 |
| 5,373,806 | 12/1994 | Logar | 117/106 |
| 5,446,824 | * 8/1995 | Moslehi | 392/416 |
| 5,618,351 | 4/1997 | Koble, Jr. et al. | 118/728 |
| 5,710,407 | 1/1998 | Moore et al. | 219/405 |
| 5,781,693 | 7/1998 | Ballance et al. | 392/416 |
| 5,830,277 | * 11/1998 | Johnsgard et al. | 118/725 |
| 5,848,889 | * 12/1998 | Tietz et al. | 432/258 |
| 6,002,109 | * 12/1999 | Johnsgard et al. | 219/390 |

* cited by examiner

*Primary Examiner*—Teresa Walberg
*Assistant Examiner*—Shawntina Fuqua
(74) *Attorney, Agent, or Firm*—Wilson Sonsini Goodrich & Rosati; Michael J. Murphy (57) ABSTRACT

A thermal processing system and method for processing a semiconductor substrate. A lamp system radiates through a window to heat the substrate. A dual gas manifold provides purge gas through a top showerhead to prevent deposits on the window and provides gas through a lower showerhead to deposit a material on the substrate. A thin support and a radiative cavity with thin radiation shields is used to support and insulate the substrate. A peripheral heater also heats the edges to enhance uniformity. An opaque quartz liner is used to reduce contaminants and undesired deposits and simplify cleaning.

22 Claims, 11 Drawing Sheets

APPARATUS AND METHOD FOR CVD AND THERMAL PROCESSING OF SEMICONDUCTOR SUBSTRATES

REFERENCE TO RELATED APPLICATION

The present application claims priority from U.S. provisional application No. 60/079,017 filed Mar. 23, 1998. Provisional application No. 60/079,017 is hereby incorporated herein by reference in its entirety.

BACKGROUND OF THE INVENTION

1. Field of the Invention

The field of the present invention relates in general to semiconductor processing. More particularly, the field of the invention relates to a system and method for chemical vapor deposition (CVD) and thermal processing, such as epitaxial deposition.

2. Background

A variety of semiconductor processes require uniform thermal processing at high temperatures. Examples of such processes include rapid thermal anneal (RTA) and CVD. In many systems, high intensity lamps (usually tungsten-halogen lamps or arc lamps) are used to selectively heat a wafer within a cold wall furnace. Since the lamps have very low thermal mass, the wafer can be heated rapidly. Rapid wafer cooling is also easily achieved since the heat source may be turned off instantly without requiring a slow temperature ramp down. Lamp heating of the wafer minimizes the thermal mass effects of the process chamber and allows rapid real time control over the wafer temperature.

However, it is often difficult to control the temperature of the semiconductor substrate using only low thermal mass lamp heating. Temperature gradients during processing can lead to defects such as crystallographic slip and non-uniform deposition of materials onto the semiconductor substrate. Some reactors use a large thermal mass silicon carbide coated graphite susceptor to maintain temperature uniformity of the substrate during processing. The substrate is placed on the susceptor which acts as a thermal ballast to even out non-uniformities across the back side of the substrate. The substrate has a high thermal conductivity, absorbs radiant energy from the lamps, and conducts it laterally to maintain temperature uniformity. The susceptor is typically wider than the substrate which allows it to compensate for radiative heat loss at the edge of the substrate.

A large thermal mass susceptor, however, retains significant thermal energy and makes it difficult to rapidly adjust the temperature of the substrate. In addition, in CVD processes, material is often deposited on the susceptor as well as the substrate. As a result, the susceptors must be cleaned and replaced from time to time. In addition, in the event of damage to the susceptor surface, pin holes may form which expose the underlying graphite and contaminate substrates placed on the susceptor.

During CVD processes, such as epitaxial deposition, undesired deposits may form on the hot susceptor as well as on other components in the reactor chamber. The chamber walls are typically cooled to inhibit deposits. Nonetheless, deposits may accumulate over time and cleaning is often necessary. Typically, an HCL gas is used to etch the unwanted deposits from non-quartz surfaces during cleaning, but the etch is not always effective for deposits on quartz. Quartz components often must be removed from the reactor for cleaning. In addition, wear from processing and cleaning can cause components and materials in the chamber to flake or spall which may interfere with the quality of some processes.

What is desired is an improved apparatus and method for CVD and/or rapid thermal processing of a semiconductor substrate. Preferably, such a system and method would provide uniform substrate processing temperature without using a large thermal mass graphite susceptor. What is also desired is an improved apparatus and method for CVD processes, such as epitaxial deposition. Preferably, such a system and method would have reduced contamination, reduced deposition on chamber walls and components and reduced wear of components, while providing simplified cleaning.

SUMMARY OF THE INVENTION

One aspect of the present invention provides a CVD reactor which is configured to reduce contamination, inhibit undesired deposits and simplify cleaning. A lamp system or other radiant heat source radiates energy into the processing chamber through a quartz window to heat a semiconductor substrate. A transmissive dual gas injection manifold is provided between the window and the semiconductor substrate. A reactant gas is dispersed through the manifold over the substrate for deposition. A purge gas is dispersed through the top of the manifold toward the window to prevent deposits from forming on the window. The purge gas then flows radially over the edges of the manifold and down the periphery of the chambers near the walls. The purge gas essentially forms a curtain which inhibits undesired deposits.

Another aspect of the present invention provides opaque liners to cover the cool chamber walls. The liners may be formed from opaque quartz. The liners absorb and reflect radiant energy during both processing and cleaning. Since the liners are warm, deposits are relatively easy to etch off during cleaning. The liners prevent stubborn deposits from forming on cold chamber walls (or cold clear quartz liners as in some conventional systems). Opaque quartz skirts may also be used to enclose the bottom portion of the chamber below the semiconductor substrate to prevent deposits on the back side of the substrate or substrate support mechanisms. Purge gas may also be provided to the region behind the substrate.

Another aspect of the present invention provides for an active ring heater and/or relatively hot thermally conductive material adjacent to the peripheral region of the substrate. The heater and/or thermal insulation compensates for edge losses and helps maintain temperature uniformity of the substrate and also depletes reactive gases near the walls and liners. The depletion of reactive gases helps prevent undesired deposits on the liners and in the region of the chamber below the substrate.

Another aspect of the present invention provides a substrate lift/rotation mechanism using support posts at the periphery of the substrate and/or substrate support and relatively flat rings or plates spaced from the substrate to lift and/or rotate the posts. The mechanism has a relatively flat thermal profile and does not disturb the thermal processing uniformity of the substrate. Rotation of the substrate during processing is used to enhance uniformity.

Another aspect of the present invention provides a thin thermally conductive substrate support which can be rapidly heated and cooled. A radiative cavity may be formed behind the substrate and/or support to provide thermal insulation and even out non-uniformities through radiative distribution of energy in the cavity to maintain equilibrium. A ring heater may also be used to heat the substrate support and/or radiative cavity to enhance uniformity.

BRIEF DESCRIPTION OF THE DRAWINGS

These and other features and advantages of the present invention will become more apparent to those skilled in the art from the following detailed description in conjunction with the appended drawings in which.

DETAILED DESCRIPTION

The following description is presented to enable any person skilled in the art to make and use the invention. Descriptions of specific designs are provided as examples. Various modifications to the preferred embodiment will be readily apparent to those skilled in the art, and the generic principles defined herein may be applied to other embodiments and applications without departing from the spirit and scope of the invention. Thus, the present invention is not intended to be limited to the embodiment shown, but is to be accorded the widest scope consistent with the principles and features disclosed herein.

Figure 1A:
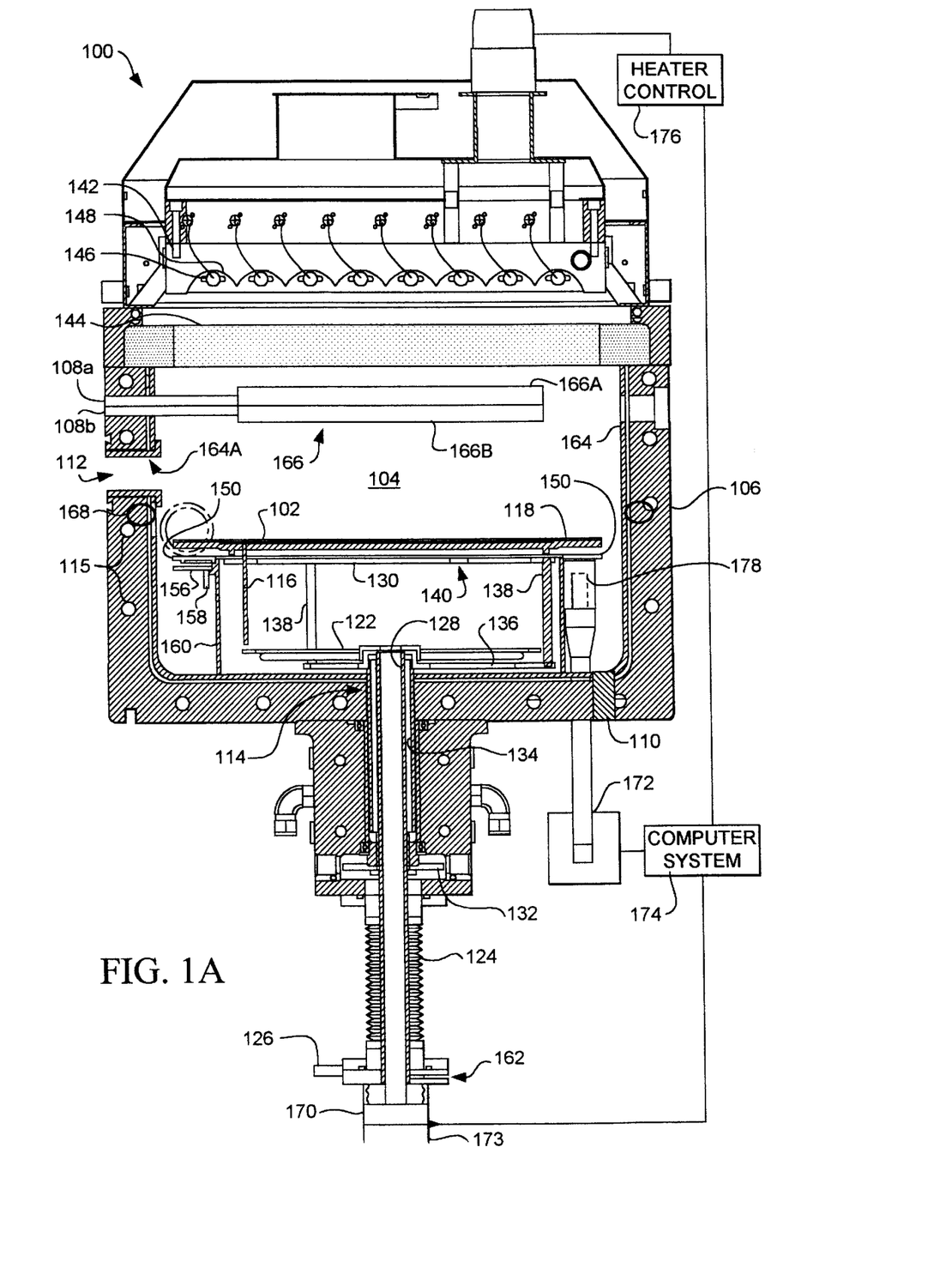
FIG. 1A is a side cross section of a reactor according to an exemplary embodiment of the present invention.

FIG. 1A is a side cross section of a CVD reactor, generally indicated at 100, according to an exemplary embodiment of the present invention. The exemplary reactor of FIG. 1A is adapted for epitaxial deposition of silicon with a high degree of uniformity and reduced contamination and deposits on reactor walls and components. Of course, a wide variety of other processes may also be carried out using aspects of the present invention.

The exemplary embodiment may be designed for use in conjunction with the Aspen# wafer handling system available from Mattson Technology, Inc., assignee of the present application. The Aspen# system allows two wafers to be handled at a time. For ease of illustration, FIG. 1A illustrates a single substrate processing station in the reactor, although it is understood that a second adjacent processing station may be included for use with the Aspen# system. Another wafer handling system adapted for 300 mm wafers may be used in conjunction with embodiments of the present invention as disclosed in provisional U.S. patent application Ser. No. 60/067,299 for Systems and Methods for Low Contamination, High Throughput Handling of Workpieces for Vacuum Processing by Fred Tabrizi et al., filed Nov. 28, 1997, assigned to the assignee of the present application and incorporated herein by reference.

Referring to FIG. 1A, a semiconductor substrate 102, such as a 200 mm or 300 mm silicon wafer, is placed in processing chamber 104 for processing. Processing chamber 104 is enclosed by chamber walls 106. Chamber walls 106 form several openings into the chamber including purge gas inlet 108*a* process gas inlet 108*b* an outlet 110 for a gas exhaust system, a port 112 forming part of a load lock mechanism for loading and unloading substrate 102, and a hole 114 through which a substrate support mechanism may enter chamber 104. Chamber walls 106 are relatively cool and are kept at a temperature of less than about 200 degrees Celsius. In the exemplary embodiment, the chamber walls 106 are stainless steel and are cooled by cooling channels 115. Water or another cooling media may be pumped through cooling channels 115 to cool the chamber walls.

Figure 2A:
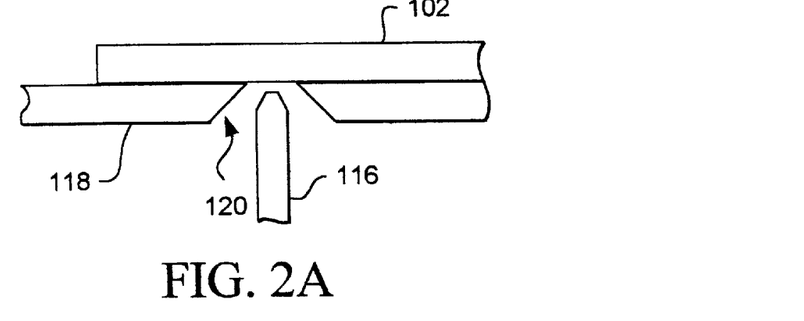
FIGS. 2A, 2B and 2C illustrate pin hole configurations which may be used in conjunction with an exemplary embodiment of the present invention.
Figure 2B:
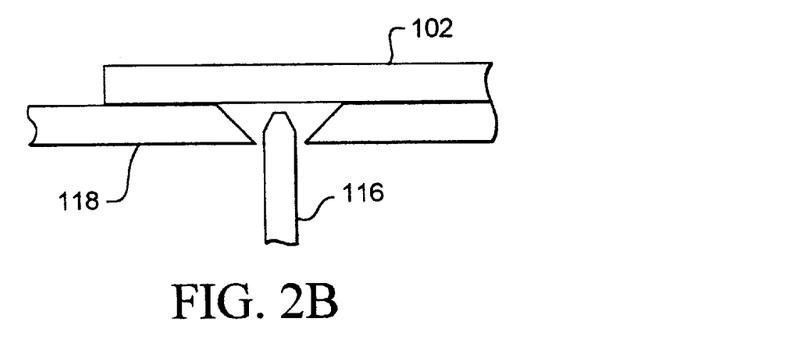
Figure 2C:
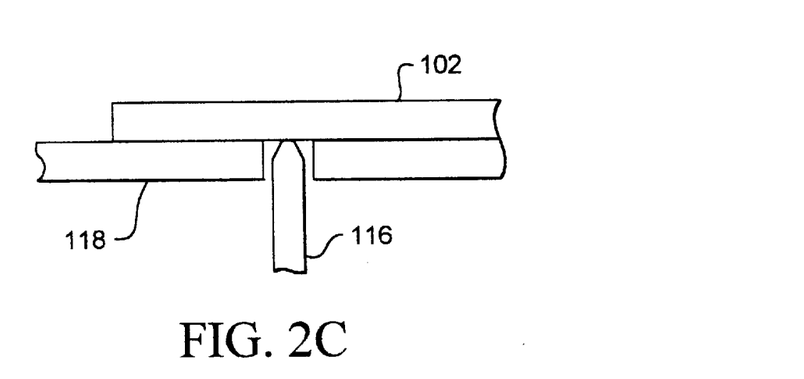

The substrate 102 is inserted into the processing chamber 104 through port 112 by a robot arm and placed upon narrow lift pins 116 which comprise silicon carbide or quartz in the exemplary embodiment. Three pins in a triangular arrangement are used in the exemplary embodiment, although only one pin is visible in the cross section of FIG. 1A. The pins are used to lower the substrate to a substrate support 118 for processing and to raise the substrate for unloading after processing. The pins engage the substrate through holes in the substrate support. To avoid thermal disturbances by the pins, the pins have a small diameter of less than about 0.15 of an inch at the top and less than about 0.100 of an inch along the straight portion of the pin body. During processing the pins are recessed between about 0.001 and 0.030 of an inch below the surface of the substrate support as shown in FIG. 2A to avoid thermal disturbances which may cause slip or thickness uniformity problems. The pin hole configuration shown in FIGS. 2A is used in the exemplary embodiment, although other pin hole configurations, such as those shown in FIGS. 2B and 2C, may be used in alternate embodiments. In the exemplary embodiment, the pin hole in the substrate support is tapered in a cone shape opening away from the substrate as shown in FIG. 2A to minimize the visibility of the hole walls 120 to the surface of the substrate (and thereby reduce heat loss from the substrate to the walls of the hole through radiation). When the pin holes are tapered in the opposite direction as shown in FIG. 2B, the substrate may lose heat to the hole and small temperature non-uniformities may result. The straight pin hole configuration shown in FIG. 2C may also be used and has a thermal effect in between those of the cone and inverted cone of FIGS. 2A and 2B.

Figure 1B:
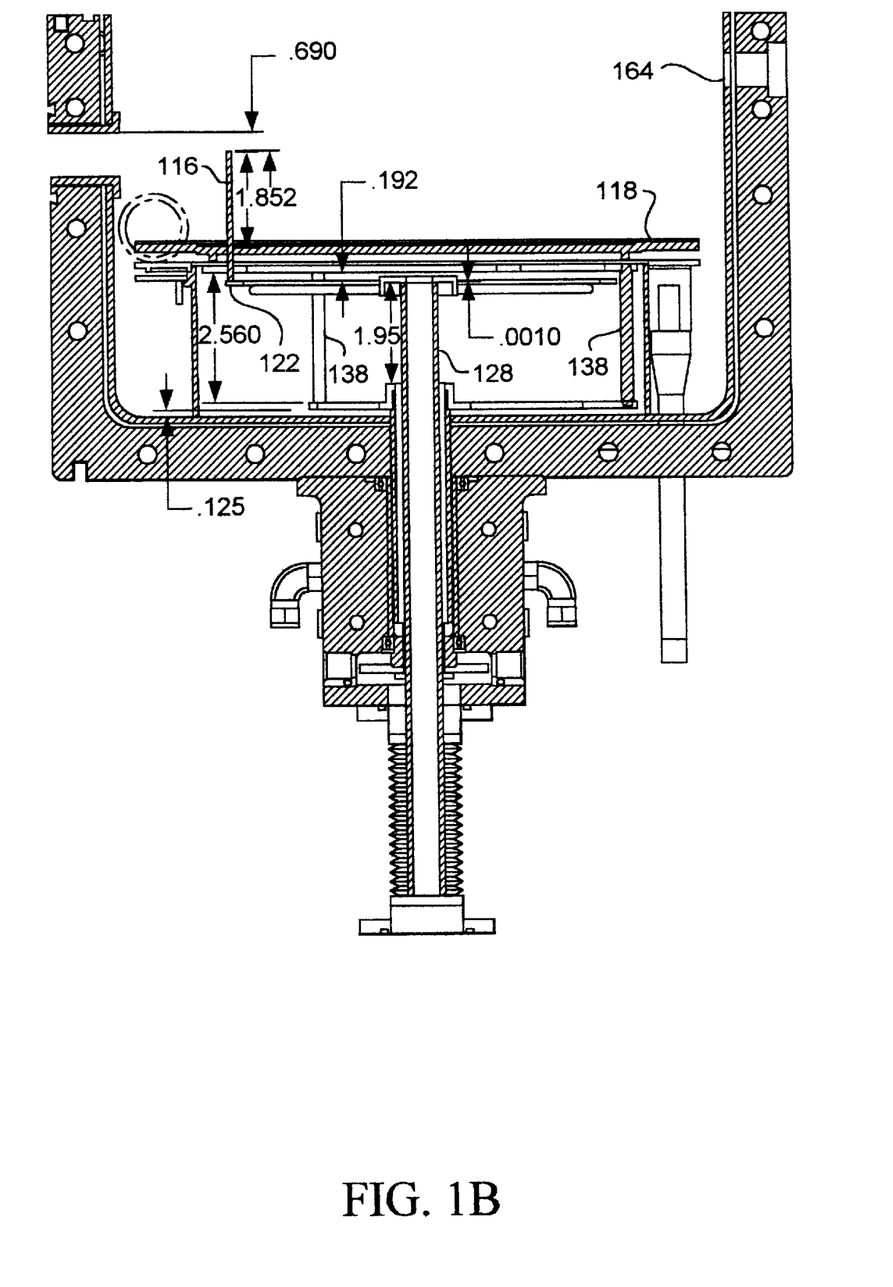
FIG. 1B is a side cross section of a reactor with lift pins in a raised position according to an exemplary embodiment of the present invention.

The pins are on a lift ring 122 that may be raised and lowered by an elevational mechanism, such as a pneumatic or electromechanical lift with a vacuum sealed bellows 124. The elevational mechanism raises and lowers a lift plate 126 and lift tube 128 which in turn raises and lowers lift ring 122 and lift pins 116. These components are shown in the raised position in FIG. 1B. The pins are raised gently to avoid scratching the substrate and are lowered smoothly to avoid production of contaminants. The lift tube and lift ring comprise opaque quartz in the exemplary embodiment. The lift ring forms a disc below the pins and disengages from the pins in the lowered position to allow rotation. The use of a disc avoids having to align the lift ring to the pins after rotation. In order to reduce thermal disturbances, however, the lift ring is not a solid disc, but rather has three thin spoke supports that connect it to a central hub (which is raised and lowered by the lift tube). The lift tube raises and lowers the lift ring via the central hub. After the substrate is loaded into the chamber and placed on pins 116, the elevational mechanism is lowered to place substrate 102 on the substrate support 118 for processing.

During processing, the substrate and substrate support are rotated to even out temperature and deposition non-uniformities. The substrate support may comprise silicon carbide, silicon, polycrystalline silicon or silicon carbide coated graphite in the exemplary embodiment. A variety of support configurations and materials may be used depending upon the desired application as discussed below. The substrate support has three holes around its outer periphery which are registered to the lift pins 116.

The substrate support 118 sits on a rotation ring 130 and is rotated by a rotational drive mechanism during processing in the range of about ten (10) to forty (40) rotations per minute. The rotational drive mechanism turns gear 132 which in turn rotates rotation tube 134, rotation plate 136, support posts 138, rotation ring 130 and substrate support 118 during processing. The rotation ring comprises opaque quartz in the first embodiment and has three small quartz support posts 140 to support the substrate support. The rotation ring also registers the lift pins to the substrate support. The rotation ring in turn is supported by three opaque quartz support posts 138 (two of which are visible in the side cross section of FIG. 1A). The support posts sit on an opaque quartz rotation plate 136. The rotation plate registers and supports the support posts and rotation ring. The rotation plate, in turn, is centered and registers to an opaque quartz rotation tube 134. The rotation plate may have holes formed in it or use spokes to reduce its mass. The lift ring also registers to the rotation tube when the lift tube is lowered and disengages from the rotation tube when it is in the raised position.

The lift tube 128, lift ring 122, rotation tube 134, rotation plate 136, support posts 138 and rotation ring 130 comprise opaque quartz in the exemplary embodiment. Opaque quartz is a better reflector than clear quartz and is easy to clean. In other embodiments, however, clear quartz could be used which would reduce absorption of radiation and thermal mass. As described below, the quartz is also kept relatively free of undesired deposits, so difficult quartz cleaning can be avoided. Of course, a variety of other materials could be used in alternative embodiments depending upon the particular application. Silicon carbide, silicon carbide coated graphite or other non-contaminating materials may be used. Some of these materials may have larger absorption and thermal mass, but may be easier to clean.

A lamp system 142 or other radiant energy heat source radiates through clear quartz window 144 to heat the semiconductor substrate 102. The lamp system 142 has sixteen elongated tungsten-halogen heating lamps 146 for a two wafer system (with eight for each wafer station) which extend across the width of the semiconductor substrate 102. Of course, arc lamps or other radiant heat sources may be used in alternate embodiments. The heating lamps 146 are seated in reflectors 148 which direct reflected radiant energy from the lamp toward the surface of the substrate. The reflectors in the exemplary embodiment are curved or conical and are coated with a highly reflective polished material such as gold. The direct and reflected light from the lamp system 142 provides radiant energy across the substrate and can be used to rapidly heat the substrate to temperatures in excess of 1200 degrees Celsius. The exemplary embodiment uses a relatively simple (and therefore less expensive) lamp arrangement than some conventional systems, because temperature non-uniformities are compensated for by other components (such as a peripheral heater, thermal insulation and/or a radiative cavity adjacent to the substrate as described below). However, other more complex arrangements of lamps may be used in other embodiments. For instance, individual lamps and heating zones may be independently controlled to enhance thermal uniformity for processing. The lamps and reflectors may also be angled or arranged elliptically in some applications.

Figure 3A:
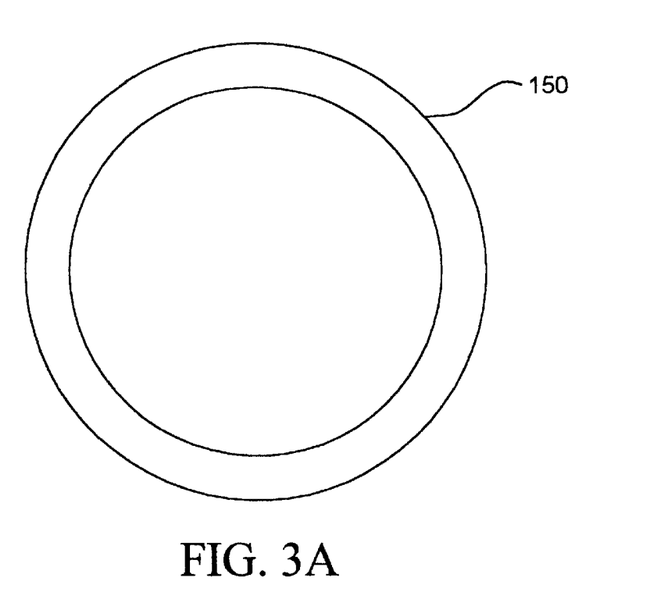
FIGS. 3A, 3B and 3C are a top plan view, side cross section and side view, respectively, of a ring heater which may be used in conjunction with an exemplary embodiment of the present invention.
Figure 3B:
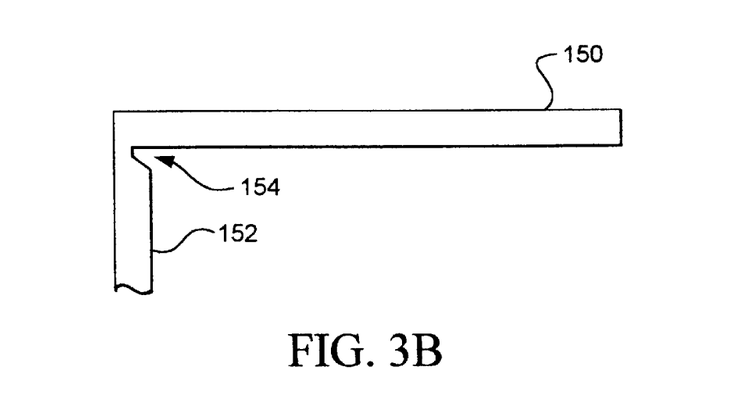
Figure 3C:
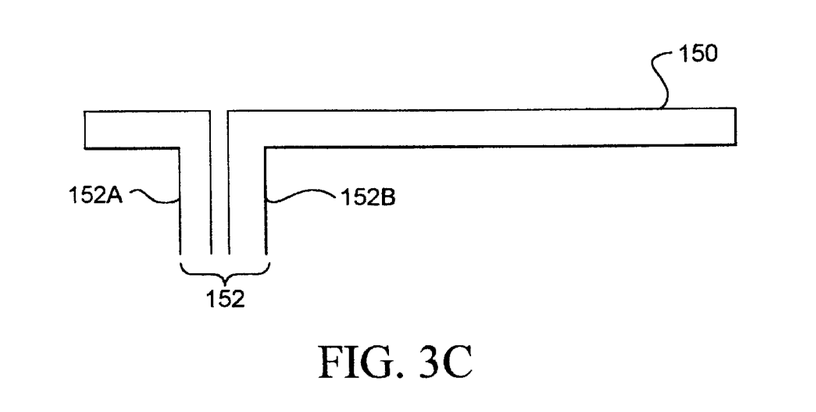

A peripheral heater, such as a resistive ring heater 150, lamp modules, or other heater arranged about the periphery of the substrate may also be used to adjust for temperature differences in the exemplary embodiment. A resistive ring heater 150 used in the exemplary embodiment is illustrated in FIGS. 3A, 3B and 3C. The ring heater 150 is a flat annular ring and may have an inner diameter slightly larger than the substrate. The ring heater comprises silicon carbide coated graphite and in the exemplary embodiment has a thickness in the range of from about 0.100 to 0.750 of an inch. An electric current loop is provided around the ring. Two adjacent silicon carbide coated graphite posts 152A and 152B provide the terminals for the heater as shown in FIGS. 3B and 3C. In order to maintain substantially uniform resistance and heat around the ring, the posts are narrowed where they connect to the ring as shown at 154 in FIG. 3B. The ring heater has a larger thermal mass than conventional lamp filaments and provides a stable band of heat around the peripheral region of the substrate. Heat is provided primarily through infrared transmission which is absorbed by the substrate support and re-radiated to the substrate. This is advantageous in a CVD system relative to filament edge heaters that rely on radiation in or near the visible spectrum, because deposits on such filament heaters can inhibit heating. In addition, the silicon carbide coated graphite ring conducts heat uniformly through a larger thermal mass band than a filament and also lasts longer and is easier to clean. The ring heater may also have cross sections with different widths and resistances to vary the heat and compensate for different temperature non-uniformities along the substrate. Additional passive and active thermal insulation may be placed below the substrate 102 and substrate support 118 to enhance uniformity. In the exemplary embodiment, a thermal insulation ring 156 comprising an annular ring of silicon carbide coated graphite is positioned below the ring heater. The ring may have a skirt as indicated at 158 in FIG. 1A which helps prevent deposits from forming on ring heater support 160. Additional rings or plates of thermally insulative materially may be arranged below the ring heater and back side of the substrate support and/or substrate as desired to compensate for thermal non-uniformities.

The ring heater 150 and thermal insulation ring 156 are supported by the ring heater support 160. The ring heater support in the exemplary embodiment comprises opaque quartz and forms a shroud or skirt around the region below the substrate 102 and substrate support 118 thereby forming an enclosed cavity. In other embodiments, clear quartz, silicon carbide, silicon carbide coated graphite or other non-contaminating materials may be used. The opaque quartz used in the exemplary embodiment, however, is relatively easy to clean, prevents radiation from interfering with temperature measurements taken from within the cavity, and prevents reactive gases from flowing into the cavity and forming undesired deposits in the cavity or on the back side of the substrate support (or on the back side of the substrate in embodiments where it is exposed to the cavity).

A purge gas may be provided through rotation tube 134 and/or lift tube 128 to the cavity to further inhibit deposits. A lower purge gas inlet 162 may be provided near the lift plate 126 as shown in FIG. 1A to provide purge gas to the tubes. The substrate support 118, ring heater 150, thermal insulation ring 156 and ring heater support 160 play an important role in keeping the walls and components in the processing chamber clean as described further below. In particular, the hot surfaces provided by the substrate support 118, ring heater 150 and thermal insulation ring 156 tend to deplete reactive gases traveling around the edge of the substrate support. As a result, deposits on the walls and ring heater support are avoided. The deposits on the support, ring heater and thermal insulation ring are easily etched as part of the cleaning process.

In order to prevent deposition on the chamber walls and significantly facilitate chamber cleaning an opaque quartz liner 164 is used to cover as completely as possible the metal chamber walls 106. A liner 164A is also provided on surfaces inside port 112. Conventional clear quartz liners may be used in some embodiments, but opaque quartz has been found to simplify cleaning. If cold chamber walls or relatively cool clear quartz liners are exposed directly to reactant gas, deposits may form which are difficult to remove. Opaque quartz, however, absorbs radiant energy from the heating lamps. The opaque liners 164 form warm walls that inhibit the formation of stubborn deposits, but do not catalyze rapid deposition to the extent that hot surfaces do (such as the hot surface of the substrate support). The opaque quartz also insulates the processing chamber and blocks direct radiative heat losses to the cold chamber walls. This insulation may inhibit undesired thermal gradients in some applications.

During cleaning, HCL gas may be provided to the chamber for etching for a period that may range from about 2 to 20 minutes depending on the application. The lamp system 142 may be used to heat the chamber at a desired cleaning temperature, which may be for instance 1100–1200 degrees Celsius. The heat absorbing silicon carbide and silicon carbide coated graphite surfaces are readily etched for cleaning. In addition, the opaque quartz surfaces are heated sufficiently (through absorption of radiant energy) to allow them to be etched for cleaning as well. The deposits on the opaque quartz are also believed to be less stubborn than deposits on cold surfaces, because the liners are warm during both the processing cycle and the cleaning cycle.

Also, to prevent unwanted deposition on the underside of window 144 as well as to inject the reactant gas for deposition and etching (for cleaning or wafer pre-etch), a dual gas injection manifold 166 is used which has a purge gas showerhead 166A on its top surface and a process gas showerhead 166B on its bottom surface. A gas supply system provides gas to the showerheads through purge gas inlet 108A and process gas inlet 108B. An exhaust system exhausts the gas through outlet 110. The gas supply system and exhaust system cooperate to maintain a desired pressure in the chamber. Atmospheric pressure may be used or a vacuum pump may be used to maintain lower pressures depending upon the requirements of the particular process.

In alternate embodiments, the purge gas showerhead 166A and the process gas showerhead 166B may be formed by two separate manifolds. In addition, for enhanced uniformity control, the process gas manifold may have two gas inlets, one that provides gas to a central region of the showerhead and one that provides gas to the outer periphery of the showerhead. The use of two concentric showerhead regions with separate gas inlet mechanisms allows gas flow to be independently controlled to enhance uniformity. In other embodiments, a double plenum or other mechanisms may be used in the process gas showerhead to provide control and enhance uniformity.

The purge gas showerhead 166A disperses non-depositing or inert gases over the underside of the window 144, purging the region between window and showerhead and preventing deposition on the window which would otherwise cause absorption of the radiation from the lamps and diminish wafer heating. The purge gas flows radially toward the circumference of the purge gas showerhead 166A between the purge shower head and the window. The purge gas then travels down the sides of the processing chamber 104 along the opaque quartz liners 164 toward the gas exhaust outlet 110 at the bottom of the chamber. The purge gas essentially forms a curtain which helps prevent deposits on the liners 164. In alternate embodiments, an outer ring of holes may also be provided around the outer edge of the process gas showerhead 166B to enhance the curtain of purge gases provided down the sides of the processing chamber.

The process gas showerhead 166B dispenses reactant gas over the surface of the substrate 102. For epitaxial deposition, silicon containing gases may be dispersed across the upper surface of the substrate to deposit Silicon or other films containing silicon. Other CVD gases may also be used for other applications. During cleaning, an etchant such as HCL may be provided through the process gas showerhead 166B. Gases such as hydrogen may also be provided during some process steps for pre-etch of a substrate to remove oxides from the surface of the substrate. The reactant gases are dispensed in a manner that allows uniform deposition over the surface of the substrate (generally within the region curtained by the purge gas).

In the exemplary embodiment the process gas showerhead is in the range of about three to four and one half inches from the substrate surface. A showerhead close to the substrate tends to be more uniform and provide more efficient deposition, but unwanted deposits also tend to form. Therefore, the distance is selected to avoid deposits, but otherwise be close to the substrate. In alternate embodiments, the distance might range from two to five inches depending upon the process and chamber configuration, or be closer if deposits can be avoided or tolerated.

The configuration and design of the holes in the showerhead may be varied to support different chamber configurations and applications. In some embodiments, numerous small holes may be arranged in straight rows or in a honeycomb pattern with equal sized holes and equal distance between holes. In other embodiments, the density and size of holes may be varied to promote more uniform deposition. In addition, the holes may be angled directionally, or the showerhead may be titled to compensate for the gas flow of the particular chamber. Generally, the sizes, pattern and direction of the holes are selected to promote uniform deposition across the substrate surface given the configuration of the chamber, exhaust port and other components.

In addition, an auxiliary gas tube 168 is provided just above the substrate around the periphery of the chamber. Holes are provided in the tube and the liner to allow the gas to enter the chamber. Purge gas or reactant gas may be provided through the auxiliary gas tube as required for the particular process. In some applications, purge gas may be provided to inhibit excessive deposits on the edge of the substrate support, on the ring heater, and on the thermal insulation ring.

The system of the first embodiment also includes a variety of subsystems for controlling thermal processing including an optical pyrometer 170, ring heater temperature sensor 172, ring heater control 173, a computer system 174, and a heater control 176. The optical pyrometer senses radiation from the back side of the substrate support or the substrate through the hollow lift tube. The ring heater support 160 blocks extrinsic light from interfering with the pyrometry. Even if the ring heater support is clear quartz, it filters wavelengths above 4.6 microns and wavelengths from about 4.8 to 5.2 microns and higher may be used for pyrometry. In other configurations, different temperature sensor arrangements may be used. For instance, a radiative/thermally insulating cavity may be formed adjacent to the substrate. The lift tube or another tube may be used to provide an optical channel into the cavity. An aperture may be formed so radiation can be sensed from the back side of the substrate inside the cavity. The lift tube may be formed from opaque quartz or silicon carbide to block extrinsic light. Various substrate support and temperature sensing arrangements are described in co-pending U.S. patent application Ser. No. 08/451,789 for Thermal Processing System with Supplemental Resistive Heater and Shielded Optical Pyrometry by Kristian E. Johnsgard et al., filed May 26, 1995 (the '789 application), and assigned to the assignees of the present invention which is hereby incorporated herein by reference. The ring heater temperature sensor 172, which may include a thermocouple 178 enclosed in a protective casing to avoid contamination, is provided for determining the temperature of the ring heater 150. A computer system 174 is operatively coupled to the optical pyrometer and ring heater temperature sensor to determine and control temperature. A heater control 176 is also operatively coupled to the computer system and may adjust the heat provided by the lamp system and ring heater during processing. A ring heater control 173 is also operatively coupled to the computer system and may adjust the electrical power provided through the posts 152 of the ring heater.

Figure 6:
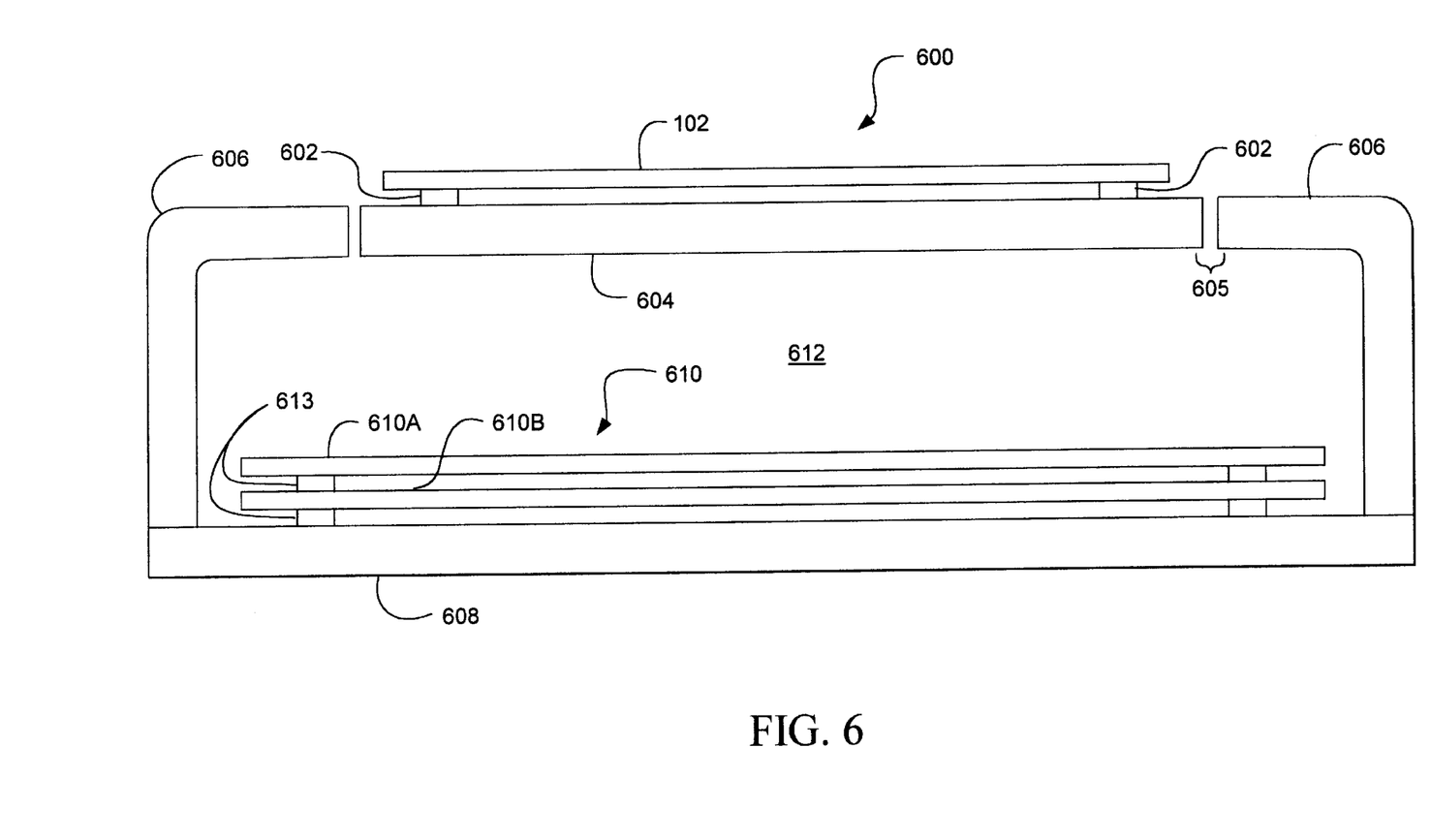
FIG. 6 is a side cross section of a substrate support that may be used in conjunction with an exemplary embodiment of the present invention.
Figure 7:
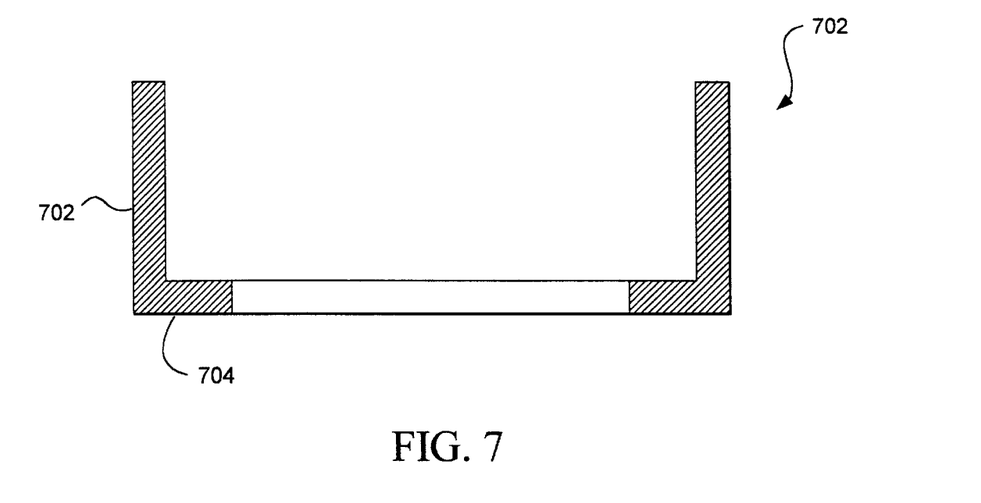
FIG. 7 is a side cross section of a peripheral heater that may be used in conjunction with an exemplary embodiment of the present invention.
Figure 8:
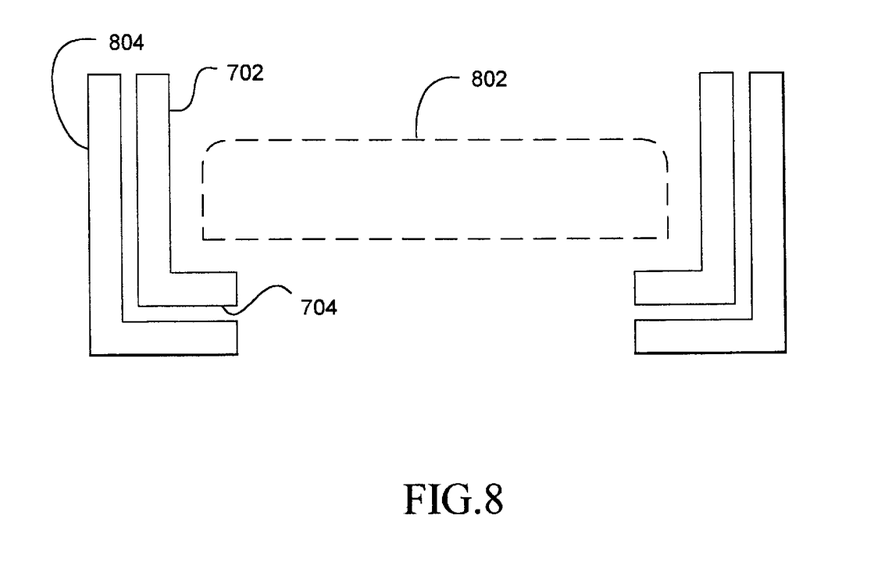
FIG. 8 is a side cross section of a peripheral heater and heat shield that may be used in conjunction with an exemplary embodiment of the present invention.

FIGS. 6, 7 and 8 illustrate alternate configurations of a substrate holder and peripheral heater that may be used in exemplary embodiments of the present invention. These configurations have produced relatively good process results. FIG. 6 is a side cross section of a substrate support 600. The substrate 102 is supported on three small islands 602, two of which are visible in the cross section of FIG. 6. Each island is near the outer edge of the wafer. The islands are relatively small and may be from about 1/16 to 1/8 inch in diameter. The islands hold the substrate slightly above a very thin support plate 604 during processing. The support is formed of silicon carbide or silicon carbide coated graphite. It may be very thin, between about 0.03 to 0.05 inches thick, and is generally less than about 0.1 inch thick. It has a slightly larger diameter than the substrate.

A small gap 605 separates support plate 604 from a side piece 606. Since the support plate 604 is covered by the substrate 102 during processing and the side piece 606 is not, the temperatures of the support plate 604 and side piece 606 may differ. If they are formed as a single piece, there may be thermal stress in some configurations. The small gap 605 separates these pieces and avoids problems from potential thermal stresses. The gap 605 is preferably very small within engineering tolerances, such as about 0.015 inches wide. Side piece 606 extends about one inch laterally from the sides of the substrate and extends downward at the outer edge by about 5/8 inch. The side piece 606 may be silicon carbide or silicon carbide coated graphite and may have the same thickness as support plate 604 or be thicker for stability. The base 608 is a disc of opaque quartz with a diameter about two and one quarter inches larger than the substrate and a thickness of about 0.060 to 0.080 inches. Radiation shields 610A and B may be stacked inside the cavity 612 formed by support plate 604, side piece 606 and base 608. The radiation shields are separated by small islands 613 about 1/32 of an inch tall. The radiation shields may be silicon carbine or silicon carbide coated graphite and may range in thickness from about 0.015 to 0.060 inches thick and are slightly larger in diameter than the substrate. A number of radiation shields may be stacked inside the cavity, ranging from 1 to 4 or more.

The substrate support 600 may be used in a reactor configuration similar to that shown in FIG. 1A. However, the base 608 may replace rotation ring 130. In addition, support posts 138 may extend through base 608 and radiation shields 610. In one embodiment, holes for receiving the support posts are formed in support plate 604 and side piece 606. The holes may be formed in the region where the small gap 605 is located. One half of each hole may be formed in the side piece 606 and the other half may be formed in the support plate 604. The support posts register in these holes and are thereby able to rotate both the side piece 606 and support plate 604 together at the same time. The base 608 and radiation shields 610 also rotate. In one embodiment, the support posts are hollow tubes of opaque quartz. The ends of the posts near the substrate have a small silicon carbide coated graphite button formed on them, so the substrate is exposed to a silicon carbide surface (similar to support plate 604 and side piece 606) rather than opaque quartz.

The substrate support 600 configuration shown in FIG. 6 provides radiation shielding behind the substrate using thin support plate 604 and thin radiation shields 610. The cavity 612 provides a shielded radiative cavity which helps even out non-uniformities and provides thermal insulation. In addition, unlike a large thermal mass susceptor, the support plate 604 and radiation shields 610 are thin (on the order of the wafer thickness) and have a lower thermal mass. They can heat up and cool down more rapidly along with the substrate.

FIG. 7 shows a side cross section of an alternate peripheral heater 700 which may be used in connection with various embodiments of the present invention. In particular, peripheral heater 700 may be used with substrate support 600 shown in FIG. 6. The peripheral heater 700 is positioned with vertical wall 702 adjacent to the edge of the substrate support 600 and substrate, rather than an annular ring as described in FIG. 3. The top of the vertical wall may be even with the substrate or extend ½ inch or more above the substrate. The dashed lines 802 in FIG. 8 illustrate the position of an exemplary substrate holder used with peripheral heater 700. The substrate holder may be configured as shown in FIG. 6 or another configuration may be used, such as the other configurations described herein. By extending above the substrate surface, the heater helps insulate the substrate holder and substrate and helps block direct radiation to the cooler chamber walls. The base 704 of the peripheral heater may form a horizontal ring for stability and may be connected to terminal posts as shown in FIG. 3. The peripheral heater may be formed from silicon carbide coated graphite and may be about 1/10 inch thick. The vertical wall may be about 1–1½ inches high and the base 704 may be about 1/8 to 1/4 inch wide. The peripheral heater 700 may be spaced from the substrate support by about 1/8 inch. Also, as shown in FIG. 8, one or more insulating walls 804 may surround the peripheral heater. The insulating walls may be formed from silicon carbide coated graphite, be about 1/10 inch thick and be spaced from the peripheral heater by about ⅛ inch. It will be understood that the above dimensions are exemplary and may be optimized for various different configurations.

The configuration shown in FIG. 8 when used with substrate support 600 provides an insulated radiative cavity to help provide uniform thermal processing of the substrate. The peripheral heater provides a stable vertical band of thermal insulation along the edges of the substrate support and extending above the substrate surface. This configuration helps reduce the potential for slip and can be used to provide good uniformity.

A wide variety of substrate supports may be used in various other embodiments of the present invention as illustrated in FIGS. 4A through 4J. Many of the substrate support designs have a relatively low thermal mass. As a result, the substrate temperature may be more rapidly adjusted in comparison to using a large thermal mass graphite susceptor. In order to provide thermal uniformity, a radiative cavity may be formed adjacent to the substrate or the thin substrate support. The radiative cavity helps provide thermal insulation without inhibiting rapid heating and cooling of the substrate as much as a large thermal mass susceptor. In addition, radiation may be sampled from within the cavity for optical pyrometry. See the '789 application. Of course in alternate embodiments, any variety of conventional substrate supports, including a large thermal mass susceptor, may be used in combination with other aspects of the present invention (such as the dual gas injection manifold, opaque quartz liners and the like).

Figure 4A:
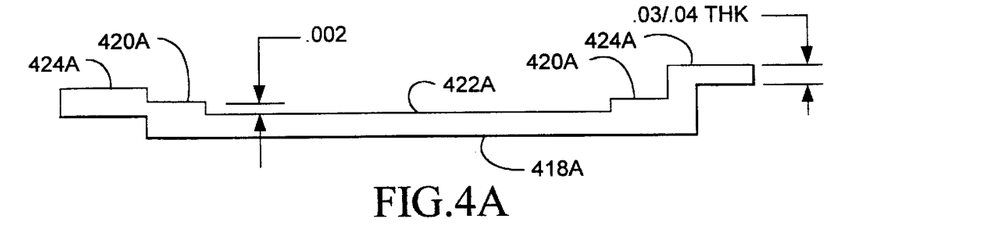
FIGS. 4A, 4B, 4C, 4D, 4E, 4F, 4G, 4H, 4I and 4J are side cross sections of substrate supports which may be used in conjunction with an exemplary embodiment of the present invention.

FIG. 4A shows a side cross section of a substrate support 418A which may be formed from silicon carbide, silicon carbide coated graphite, silicon or other non-contaminating material. The support is relatively thin and heats and cools rapidly with the substrate. For instance the support may be from about 0.020 to 0.150 of an inch thick. Silicon carbide coated graphite may be used for thicker supports. Generally, however, a 0.030 to 0.040 inch thick piece of silicon carbide is used. A pure silicon carbide support has the advantage of not exposing the substrate to graphite contaminants if the support wears down over time. The substrate is supported at the edges by an annular shelf 420A formed by the support. The support recesses a few thousands of an inch to form a shallow cavity 422A behind the back side of the substrate (or in alternate embodiments may be flat as shown in FIG. 6). This cavity allows the substrate to bow slightly when heated. The support is raised at the edges 424A to provide thermal insulation at the edges of the substrate and prevent direct radiative losses from the edges of the substrate to cool chamber surfaces. The ring heater 150 or thermal insulation may be provided below the raised edges 424A to further decrease edge losses and enhance thermal uniformity.

Figure 4B:
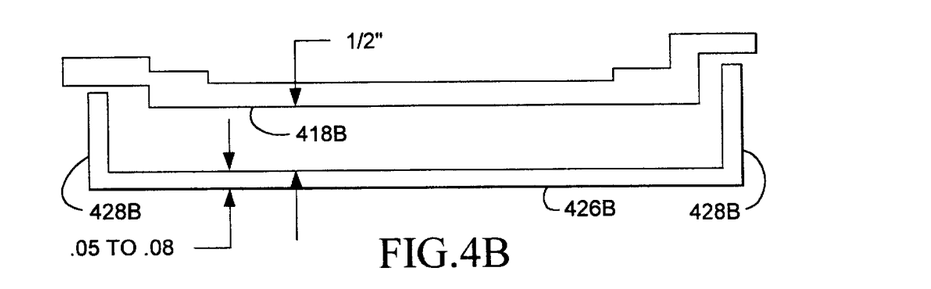
Figure 4C:
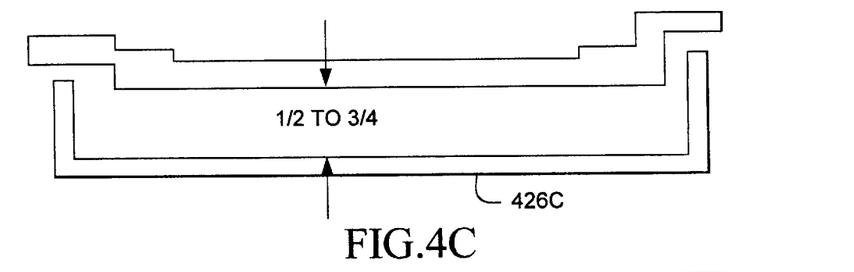
Figure 4D:
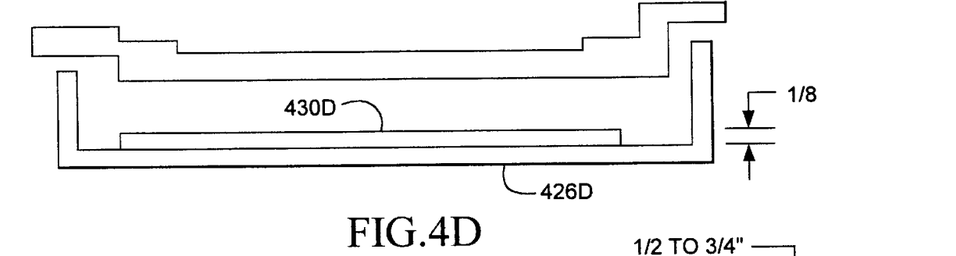

FIG. 4B shows a side cross section of a substrate support 418B similar to the support described in connection with FIG. 4A except that an additional radiation shield 426B is provided below the support. The radiation shield has minimal or no contact with the support 418B to avoid thermally conductive disturbances. The radiation shield 426B may comprise a thin piece of silicon carbide between about 0.050 to 0.080 of an inch thick. The radiation shield heats up rapidly and radiates across the back side of the support 418B. The ring heater 150 is adjacent to the edges 428B of the radiation shield to maintain a reasonably uniform temperature at the edges. The shield forms a radiative cavity about one half to three quarters of an inch deep behind the support and substrate which helps even out non-uniformities and provides thermal insulation. In an alternate embodiment, the radiation shield 426C may comprise opaque quartz having a thickness of about 0.10 of an inch as shown in FIG. 4C. Opaque quartz provides additional insulation, but does not heat and cool as rapidly as a thin piece of silicon carbide. FIG. 4D shows another configuration with an opaque quartz radiation shield 426D which also has a silicon carbide or silicon carbide coated graphite disk 430D inside the cavity. The conductive disk provides rapid heating and the opaque quartz provides increased insulation.

Figure 4E:
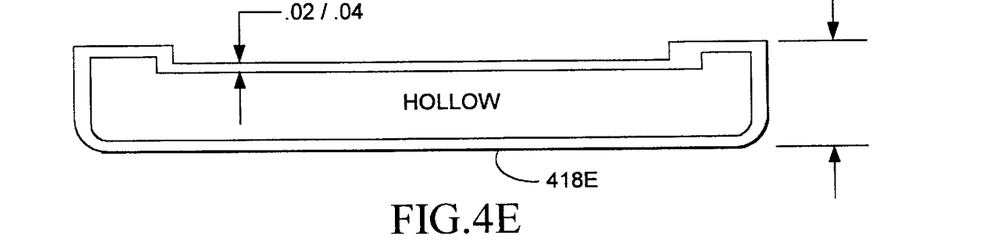

FIG. 4E shows another configuration for a substrate support 418E which has properties similar to those described above. The support of FIG. 4E is hollow and has a thin wall of silicon carbide about 0.020 to 0.040 of an inch thick. The hollow support forms a radiative cavity during processing. The support of FIG. 4E may be manufactured by forming silicon carbide coated graphite. A hole may then be formed in the silicon carbide and the graphite may be burned out. This leaves a thin silicon carbide shell which can be used as a substrate support. This design may be used to provide a very thin layer of silicon carbide that is still relatively strong.

Figure 4F:
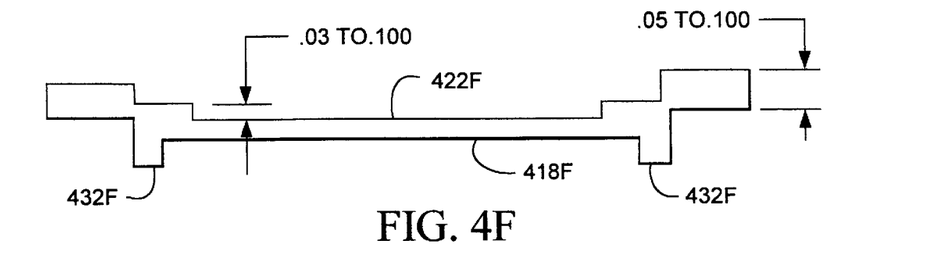

FIG. 4F shows a side cross section of another substrate support 418F. This support comprises silicon carbide or silicon carbide coated graphite with a thickness in the range of about 0.050 to 0.100 of an inch. The support includes ribs 432F which provide rigidity and strength. The recessed region 422F may range from about 0.030 to 0.100 of an inch thick. The recessed region forms a radiative cavity adjacent to the substrate.

Figure 4G:
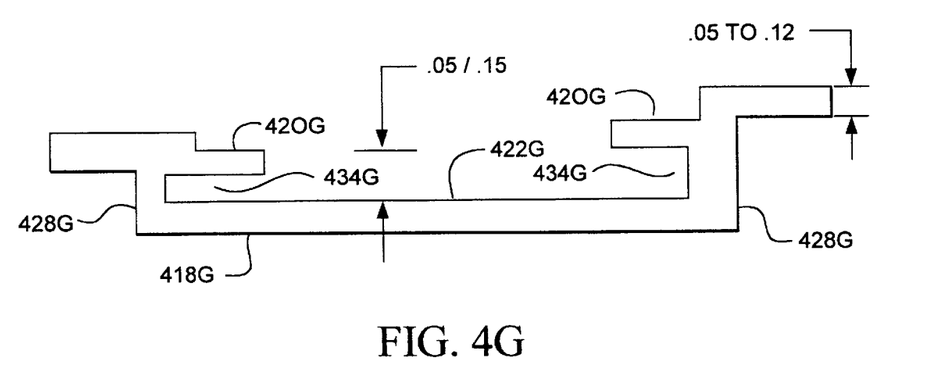

FIG. 4G shows a side cross section of another substrate support 418G. This support comprises silicon carbide or silicon carbide coated graphite with a thickness in the range of about 0.050 to 0.120 of an inch. The support includes a recessed region 422G below the substrate about 0.050 to 0.150 of an inch deep. The recessed region forms a radiative cavity adjacent to the substrate. The area 434G below the shelf 420G for the substrate is hollowed out to form part of the cavity. This allows the shelf to radiate to a radiative cavity in the same manner as the back side of the substrate. This helps maintain uniform thermal properties at the edge of the substrate. Without the hollow area 434G, the shelf 420G would tend to conduct and radiate heat away from the substrate through side walls 428G which may result in edge losses and non-uniformities.

Figure 4H:
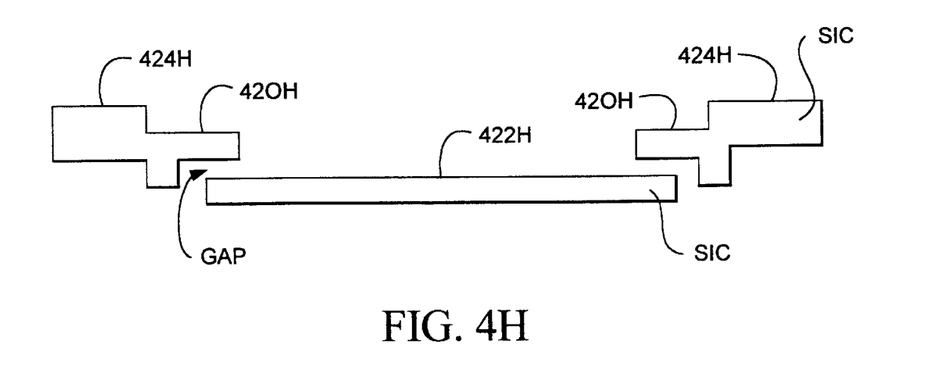

FIG. 4H shows a side cross section of another substrate support. This support may be configured similar to the supports described in connection with FIGS. 4A, 4F and 4G, except that the shelf 420H and raised edge 424H are formed by a separate piece from the recessed portion 422H. This allows the shelf 420H to be heated by the ring heater to a different degree than the recessed portion (without direct conduction from the shelf to the recessed piece). This configuration may be useful to provide increased heat and insulation at the edge of the substrate.

Figure 4I:
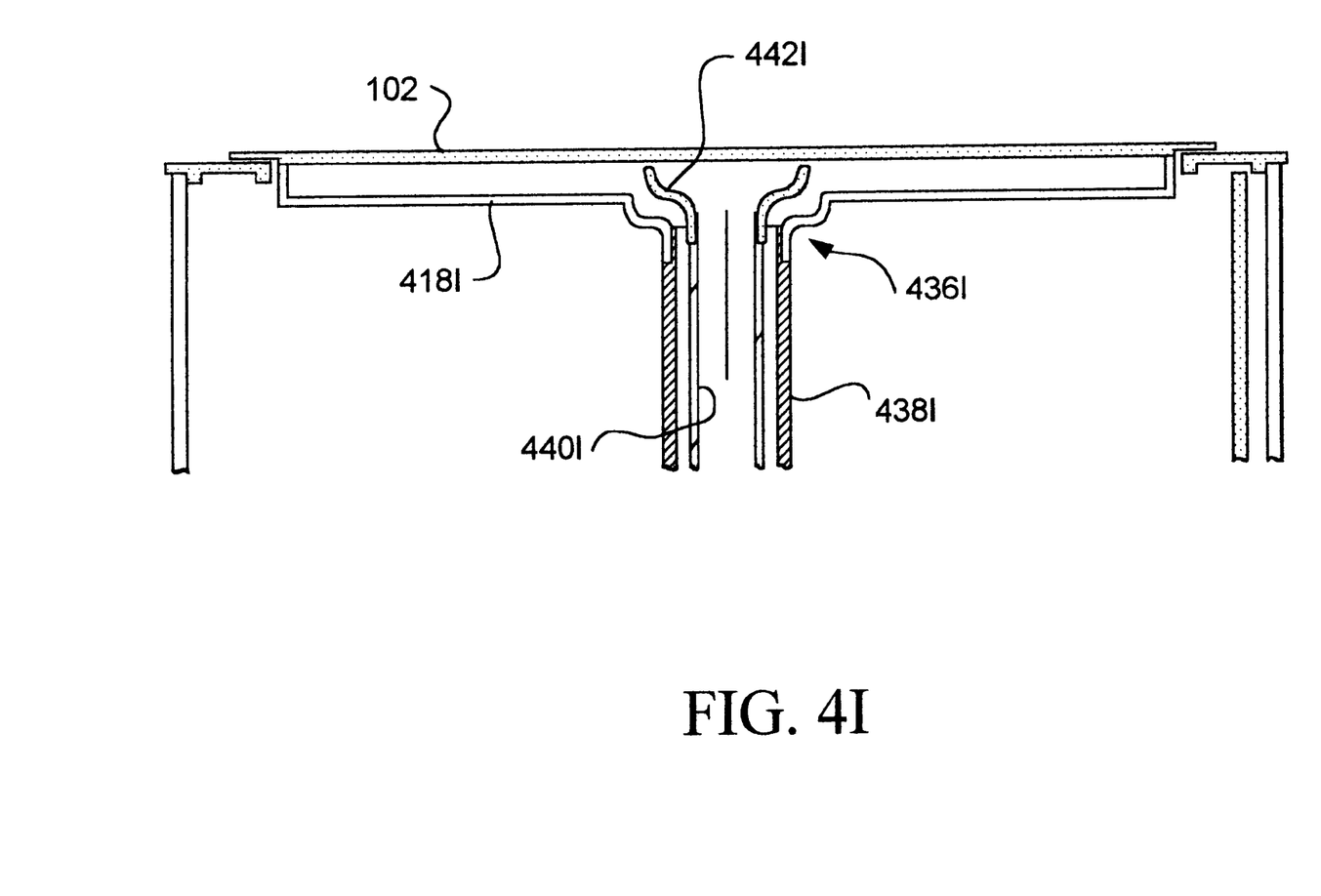

FIG. 4I shows a side cross section of another substrate support 418I. This support is similar to that described above in connection with FIG. 4G except that a hole 436I is provided in the center of the support. A rotation tube 438I rotates the support. A lift tube 440I raises and lowers the substrate by extending through the hole. A cup or spoke support 442I is formed on the end of the lift tube to raise and lower the substrate instead of using lift pins. An optical sensor may be inserted through the lift tube to sense radiation from the cavity and back side of the substrate for optical pyrometry.

Figure 4J:
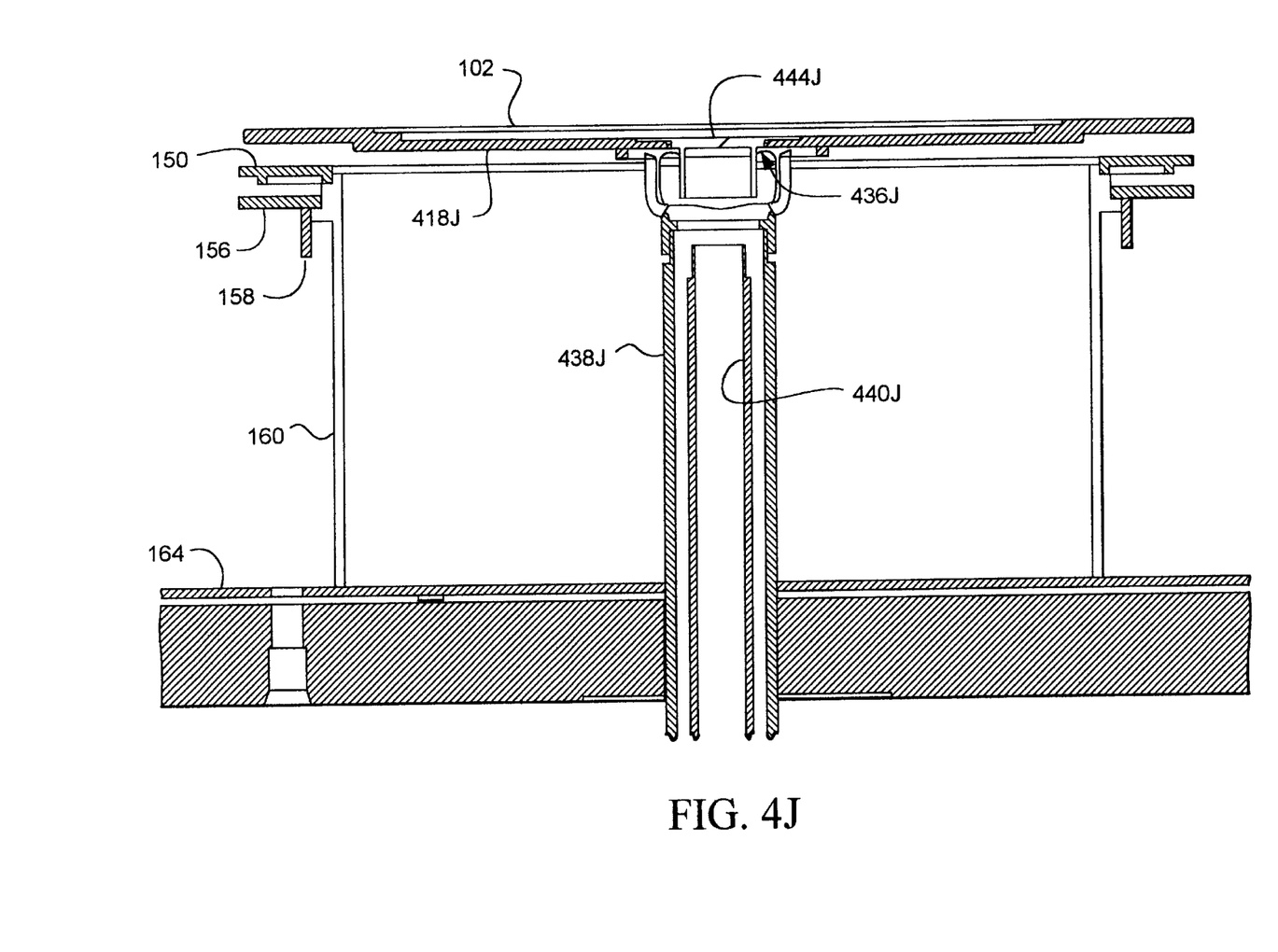

FIG. 4J shows a side cross section of another substrate support 418J. This support is similar to the support of FIG.

4I and has a hole 436J, rotation tube 438J and lift tube 440J. Instead of a cup or spoke, however, a flat lift plate 444J is used to lift the substrate.

With each of the above configurations different non-contaminating materials (such as silicon carbide) and thicker supports may be used in alternate embodiments. However, thin supports allow rapid heating and cooling. In addition, an aperture may be formed in the supports in various embodiments to allow radiation to be sensed from the back side of the substrate for optical pyrometry.

Figure 5:
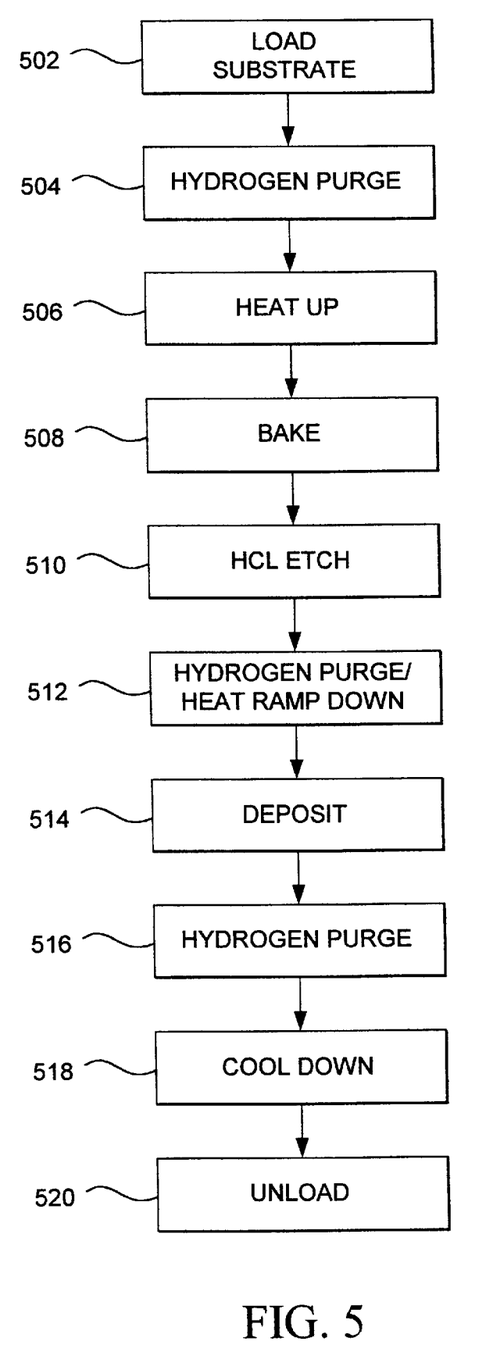
FIG. 5 is a flow chart of a process which may be used in conjunction with an exemplary embodiment of the present invention.

The operation of the exemplary embodiment of FIG. 1A will now be described in connection with an exemplary epitaxial deposition process. The steps in the exemplary epitaxial deposition process are illustrated in FIG. 5. Initially, a substrate is loaded as indicated at step 502. A silicon substrate is placed onto the lift pins 116 by a robot arm. The lift tube 128 is lowered and the substrate 102 is placed on the substrate support 118. The processing chamber is maintained at atmospheric pressure. As indicated at 504, a hydrogen purge step is then performed. Hydrogen gas is provided through process gas inlet and dispersed by process gas showerhead. As indicated at 506, heat up then occurs. The lamp system and ring heater are heated to ramp the substrate temperature. As indicated at 508, an optional bake step may then be performed. The lamps and heater are held at an elevated temperature to bake out contaminants from the substrate. An optional HCl etch may then be performed as indicated at 510. HCL gas is provided through the process gas showerhead to perform the etch. The HCL gas is then turned off and hydrogen is provided through the process gas showerhead to purge the system as indicated at 512. At the same time, the temperature of the substrate is ramped down to the desired deposition temperature. Silicon forming gas (such as trichlorosilane ($SiHCl_3$), dichlorosilane ($SiH_2Cl_2$), or the like) is then provided through the process gas showerhead for epitaxial deposition as indicated at 514. A dopant gas, such as $B_2H_6$ may also be used in some processes. In the exemplary process, the pressure remains at atmosphere during deposition. Purge gas is also provided through purge showerhead. Process gas is then turned off and hydrogen is provided through the process gas showerhead to purge the system as indicated at 516. At the same time, the temperature of the substrate is ramped down. During each of the above etch and deposition steps, the substrate may be rotated to enhance uniformity.

The wafer then cools down as indicated at 518. Normally as a wafer cools in a cold wall chamber, there will be large heat losses at the wafer edges due to the proximity of the walls. In order to compensate for this effect, the temperature of ring heater 150 is carefully controlled based on the measurements of the optical pyrometer and ring heater sensor. Even after the power to the lamps 146 and ring heater 150 has been shut off, the wafer may be left in place for a short period of time. During this period of time, the thermal insulation provided by the ring heater 150 continues to compensate for edge heat losses which allows for more uniform cooling. The lift tube 128 is then raised and the substrate is unloaded from the chamber through a conventional load lock mechanism as indicated at 520.

While this invention has been described and illustrated with reference to particular embodiments, it will be readily apparent to those skilled in the art that the scope of the present invention is not limited to the disclosed embodiments but, on the contrary, is intended to cover numerous other modifications and equivalent arrangements which are included within the spirit and scope of the following claims.

What is claimed is:

1. A thermal processing system for processing a semiconductor substrate, said system comprising:
   a processing chamber with chamber walls;
   opaque quartz liners adjacent to the chamber walls;
   a substrate support for supporting the substrate in the processing chamber;
   a lamp system positioned above the substrate support for heating the substrate;
   a gas source for providing a deposition gas to the processing chamber to form a desired deposit on the substrate; and
   a peripheral heater positioned adjacent to the periphery of the substrate support to preferentially heat the edge of the substrate.

2. A thermal processing system for processing a semiconductor substrate, said system comprising:
   a processing chamber with chamber walls;
   a substrate support for supporting the substrate in the processing chamber;
   a lamp system positioned above the substrate support for heating the substrate;
   a window between the lamp system and the substrate support; and
   a gas source for providing a deposition gas and a purge gas to the processing chamber, the gas source comprising a dual gas manifold having a lower showerbead for dispensing the deposition gas to form a desired deposit on the substrate and an upper showerhead for dispensing a purge gas toward the window to prevent deposition on the window.

3. A thermal processing system for processing a semiconductor substrate, said system comprising:
   a processing chamber with chamber walls;
   a support for supporting the substrate in the processing chamber;
   opaque liners between the support and side walls of the processing chamber;
   a heating system configured to heat the substrate on the support and which also heat the opaque liners to an elevated temperature;
   a gas supply system configured to provide a heat activated deposition gas to the processing chamber to form a desired deposit on the substrate.

4. The thermal processing system of claim 1 in which there is a circumferential shroud which surrounds the base of the support structure which supports the backside wafer shield, the shroud being sized so that it spans virtually the entire distance between the substrate support and the bottom of the chamber and wherein the volume within this shroud is purged with non-depositing gas so as to prevent deposition on the backside of the support structure.

5. The thermal processing system of claim 4 wherein the shroud is made of quartz or other high temperature compatible materials.

6. The system of claim 3 wherein there are two substrates which are positioned adjacent to each other in the chamber, each having its own support structure and peripheral heater, so as to permit simultaneous processing of both wafers.

7. The system of claim 3 wherein the region proximate to an opening in the chamber wall used to load and unload substrates is purged with non-depositing gas to prevent deposition in this region.

8. The system of claim 3 further comprising means for rotating the substrate.

9. The system of claim 3 further comprising means for injecting gas from the sides of the chamber walls.

10. The system of claim 1, wherein the peripheral heater comprises a vertical wall surrounding the substrate support, a top portion of the vertical wall extending above the above the upper surface of the substrate support.

11. The system of claim 10, further comprising an insulating wall surrounding the peripheral heater.

12. The system of claim 2, further comprising a peripheral heater positioned adjacent to the periphery of the substrate support to preferentially heat the edge of the substrate, the peripheral heater comprising a vertical wall surrounding the substrate support such that a top portion of the vertical wall extends above the above the upper surface of the substrate support.

13. The system of claim 2 wherein the upper showerhead is configured to dispense the purge gas toward the window and then radially over the dual gas manifold and down the sides of the processing chamber to form a curtain.

14. The system of claim 2 wherein the lower showerhead is divided into an inner region and a peripheral region, each of inner and peripheral regions having separately controllable flow rates.

15. The system of claim 2 wherein the lower showerhead further comprises and an outer ring of holes for dispensing a purge gas down the sides of the processing chamber.

16. The system of claim 2 further comprising an auxiliary tube disposed circumferentially around the processing chamber above the substrate holder, the auxiliary tube for providing a purge gas to the processing chamber through holes in the walls of the processing chamber.

17. The system of claim 3 wherein the heating system comprises a lamp heating system.

18. The system of claim 17 further comprising a window between the lamp heating system and the support.

19. The system of claim 18 the gas supply system comprises a double showerhead having a lower showerhead for dispensing the deposition gas to form a desired deposit on the substrate and an upper showerhead for dispensing a purge gas toward the window to prevent deposition on the window.

20. The system of claim 3, wherein the opaque liner comprises opaque quartz walls.

21. The system of claim 20 wherein the deposition gas comprises a silicon depositing gas for epitaxial deposition.

22. The system of claim 21, further comprising a peripheral heater positioned adjacent to the periphery of the substrate support to preferentially heat the edge of the substrate, the peripheral heater comprising a vertical wall surrounding the substrate support such that a top portion of the vertical wall extends above the above the upper surface of the substrate support.

* * * * *